United States Patent
Tian

(12) 
(10) Patent No.: US 6,624,710 B2
(45) Date of Patent: Sep. 23, 2003

(54) EXTERNAL OSCILLATOR RESISTOR DETECTION CIRCUIT

(75) Inventor: Lijun Tian, Shenzhen (CN)

(73) Assignee: Shenzhen STS Microelectronics Co. Ltd. (CN)

(*) Notice: Subject to any disclaimer, the term of this patent is extended or adjusted under 35 U.S.C. 154(b) by 8 days.

(21) Appl. No.: 10/033,991

(22) Filed: Dec. 27, 2001

(65) Prior Publication Data
US 2002/0053951 A1 May 9, 2002

(30) Foreign Application Priority Data
Jan. 2, 2001 (CN) ........................ 01101216 A

(51) Int. Cl.$^7$ ............... H03B 5/00; H03B 5/24
(52) U.S. Cl. .............. 331/179; 331/57; 331/143; 331/185; 331/186
(58) Field of Search ............... 331/57, 65, 111, 331/108 C, 108 D, 135, 143, 179, 185, 186

(56) References Cited

U.S. PATENT DOCUMENTS 5,589,802 A * 12/1996 O'Shaughnessy et al. .... 331/44

* cited by examiner

Primary Examiner—David C. Mis
(74) Attorney, Agent, or Firm—Lisa K. Jorgenson; Andre Szuwalski

(57) ABSTRACT

An integrated circuit chip includes an RC oscillator circuit. The frequency of the output signal generated by the oscillator output signal is set as a function of a value of an included internal resistor integrated on the chip. An external resistor may be connected to the chip to allow a user to manipulate the oscillator output signal frequency. A detection circuit on the chip detects the presence of the connected external resistor. Responsive to that detection, a substitution circuit operates to substitute the connected external resistor for the internal resistor in the RC oscillator circuit. This effectuates a change of the frequency of the oscillator output signal to instead be set as a function of a value of that connected external resistor.

19 Claims, 3 Drawing Sheets

EXTERNAL OSCILLATOR RESISTOR DETECTION CIRCUIT

BACKGROUND OF THE INVENTION

1. Technical Field of the Invention

The present invention relates to RC oscillator circuits implemented within integrated circuits and, in particular, to circuits that enable a switching of the integrated oscillator circuit to instead utilize an off-chip resistor component.

2. Description of Related Art

Resistor/capacitor (RC) oscillators of many different configurations are well know to those skilled in the art. Such oscillators are commonly built using discrete components. However, placement of these oscillators onto an integrated circuit chip is often necessary. When fully integrated (i.e., all components exist on the chip) the designer and user unfortunately lose much if not all of the ability to control oscillator operation through manipulation of either the resistance or capacitance values that drive oscillator operation. There is accordingly a need for a fully integrated oscillator design that also supports connection of an off-chip resistor.

SUMMARY OF THE INVENTION

An RC oscillator circuit implemented on an integrated circuit chip generates an oscillator output signal having a frequency set as a function of a value of an included internal resistor. The chip includes a pin to which an external resistor may be connected. A detection circuit detects the presence of the connected external resistor. Responsive to that detection, a circuit operates to connect the external resistor to the oscillator resulting in a change of the output oscillator frequency which is now set as a function of at least a value of that connected external resistor. In a preferred embodiment, the circuit operates to substitute the connected external resistor in the RC oscillator circuit.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
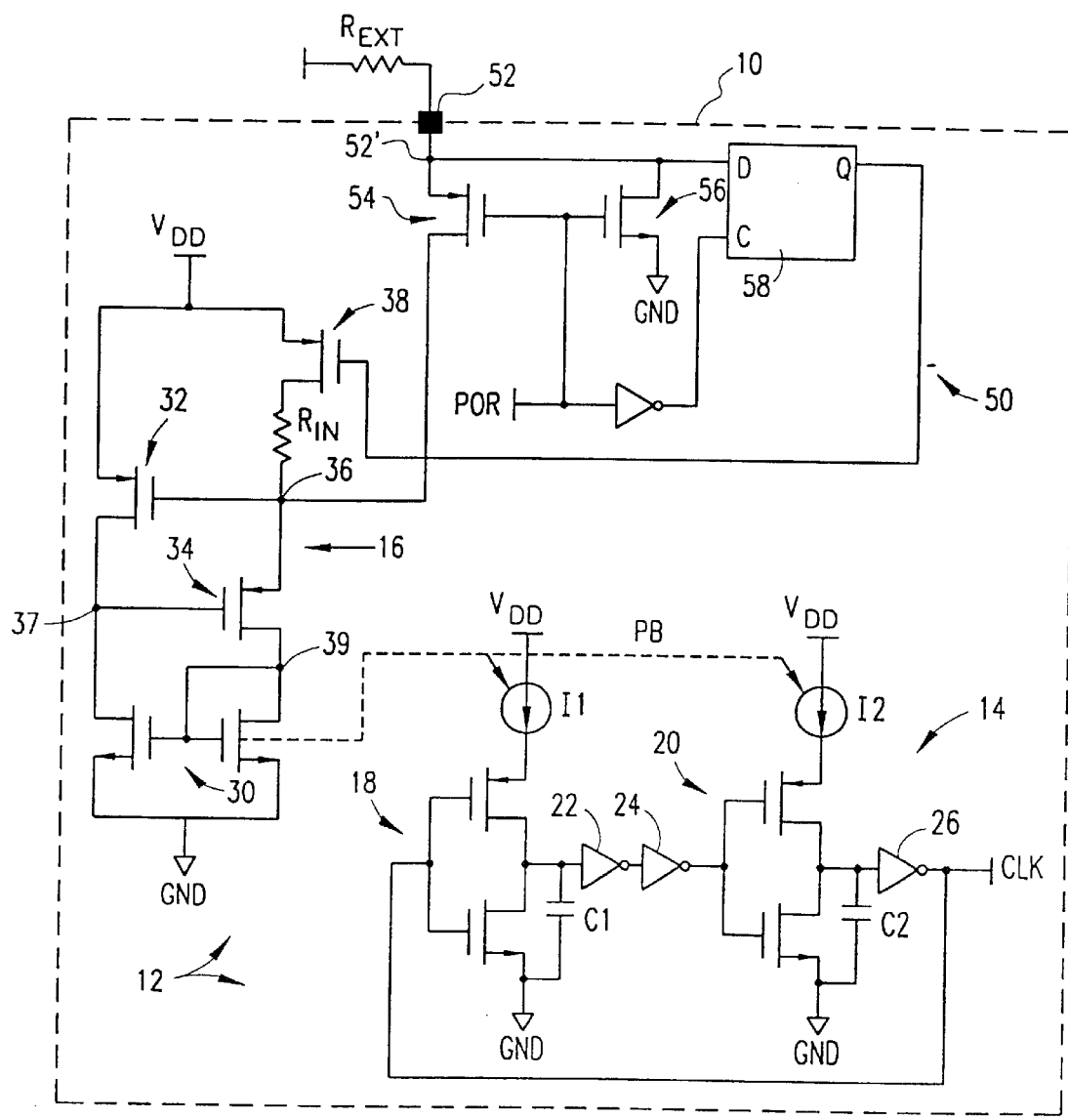
FIG. 1 is a schematic diagram of a circuit in accordance with the present invention.

Reference is now made to FIG. 1 wherein there is shown a schematic diagram of a circuit in accordance with the present invention. The circuit is preferably implemented on an integrated circuit chip 10 that may include components in addition to those illustrated in FIG. 1 and perform functions and operations in addition to those described herein in connection with the present invention. The circuit comprises an RC oscillator 12 formed by an oscillating circuit 14 and a current source 16.

The oscillating circuit 14 includes a first current generator I1 that provides a first current used to charge capacitor C1. A first CMOS inverter circuit 18 controls charging of the capacitor C1 which is connected in parallel configuration between the drain and source of the included n-channel FET of the inverter circuit. When the tied gates of the series connected FETs of the circuit 18 are driven low, capacitor C1 is charged by first current generator I1. Conversely, when the tied gates are driven high, capacitor C1 is discharged to ground (GND). A second CMOS inverter circuit 20 operates in a similar manner to control the charging of capacitor C2 using the current output from second current generator I2. The tied drains of the first CMOS inverter circuit 18 are connected to the tied gates of the second CMOS inverter circuit 20 through series connected inverters 22 and 24. The tied drains of the second CMOS inverter circuit 20 are connected to the tied gates of the first CMOS inverter circuit 18 through a single inverter 26. The output oscillator clock signal (CLK) is taken from the output of the inverter 26.

When CLK is low, this means that the voltage across capacitor C2 is higher than the threshold voltage of the inverter 26. With this condition, inverter 26 output is low, the tied gates of first inverter circuit 18 are low and the first capacitor C1 is charged by first current generator I1. When the voltage across first capacitor C1 reaches the threshold voltage of inverter 22, its output goes low and the output of inverter 24 goes high. This condition changes the state of circuit 20 (because its tied gates are now high) and causes previously charged capacitor C2 to discharge. With voltage at the input of inverter 26 now low due to capacitor C2 discharge, the output of the inverter 26 and hence the clock CLK now go high. As a result, the state of circuit 18 changes (because its tied gates are now high) and capacitor C1 is discharged. When the voltage across capacitor C1 becomes lower than the threshold voltage of inverter 22 due to capacitor C1 discharge, the output of the inverter 22 goes high and the output of inverter 24 goes low. This condition changes the state of circuit 20 and results in the charging of capacitor C2, and the changing of the inverter 26 output (and hence clock CLK) back to low. This chain of events continues generating an oscillating output clock CLK whose frequency of oscillation is determined by the values of I1, I2, C1 and C2.

The current source 16 provides a very stable (but changeable, as will be further discussed herein) reference signal PB that is used by the first and second current generators I1 and I2 to generate the first and second currents, respectively. The current source 16 includes a current mirror 30 formed in a conventional manner by a pair of n-channel FETs whose gates and grounded sources are tied together. A pair of p-channel FETs are drain connected to the legs (drains) of the current mirror 30 and are inter-connected with each other such that the gate of a first FET 32 is connected to the source the second FET 34 and one terminal of an internal resistor (Rin) at node 36, while the gate of the second FET 34 is connected to the drain of the first FET 32. The source of the first FET 32 is connected to Vdd and the other terminal of Rin is connected to Vdd through a p-channel FET 38.

When the gate of p-channel FET 38 is high, the reference signal PB is generated by the current mirror 30 with the value of that signal being set by the value of the internal resistor Rin. Thus, it is the value of internal resistor Rin that sets the value of the currents provided by the first and second current sources I1 and I2, respectively, and hence also sets the oscillation frequency of the clock CLK output from the oscillator circuit 14. It is recognized, however, that the resistor Rin and capacitors C1 and C2 are internal to the integrated circuit chip 10 and thus the combined circuits 14 and 16 fail to provide a mechanism for a user to manipulate the value of the oscillation frequency.

To address this need for manipulation, the circuit of the present invention further includes an external oscillation resistor detection and connection circuit 50. Use of the circuit adds an extra pin 52 (and corresponding node 52') to the integrated circuit chip 10 to which a user may electrically connect an external resistor (Rext) for the purpose of manipulating the value of the oscillation frequency. The circuit 50 includes a p-channel FET 54 whose source is connected to pin 52 and whose drain is connected to node 36 of the current source 16. An n-channel FET 56 is also included in the circuit 50 and connected such that its drain is connected to pin 52 and its source is connected to ground (GND). The gates of FETs 54 and 56 are tied to each other and are connected to receive a power-on-reset (POR) signal that may be generated either on or off of the chip 10. The pin 52 is further connected to the D input of a D-type flip-flop 58. The clock (C) input of the flip-flop 58 is connected through an inverter 60 to receive the power-on-reset signal. The output (Q) of the flip-flop is connected to drive the gate of FET 38 within the current source 16.

The circuit 50 operates to perform two important functions. A first function is to detect the connection of the external resistor Rext to the pin 52. This first function is implemented through a detection sub-circuit comprising components 52, 56 and 58. Responsive to that detection, a second function is performed to generally connect the external resistor Rext to the oscillator and, more particularly, to control the disconnection of resistor Rin from the current source 16 and provide for the replacement of that resistance with the resistance of the external resistor Rext. This second function is implemented through substitution sub-circuit that is implemented through component 54 and component 38 of the current source 16. When this substitution occurs, the reference signal PB is still generated by the current mirror 30 with the value of that signal being instead set by the values of the external resistor Rext. The value Rext now sets the value of the currents provided by the first and second current sources I1 and I2, respectively, and hence also sets the oscillation frequency of the clock CLK output from the oscillator circuit 14. When in this configuration, unlike the Rin configuration discussed above, a resistor (Rext) external to the integrated circuit chip 10 is available to enable a user to manipulate the value of the oscillation frequency. Although the preferred embodiment calls for a resistive substitution, it will be understood that a simple connection of the external resistor Rext to the oscillator circuit (along with continued connection of the internal resistor Rin) may also effect a change in oscillation frequency.

Figure 3A:
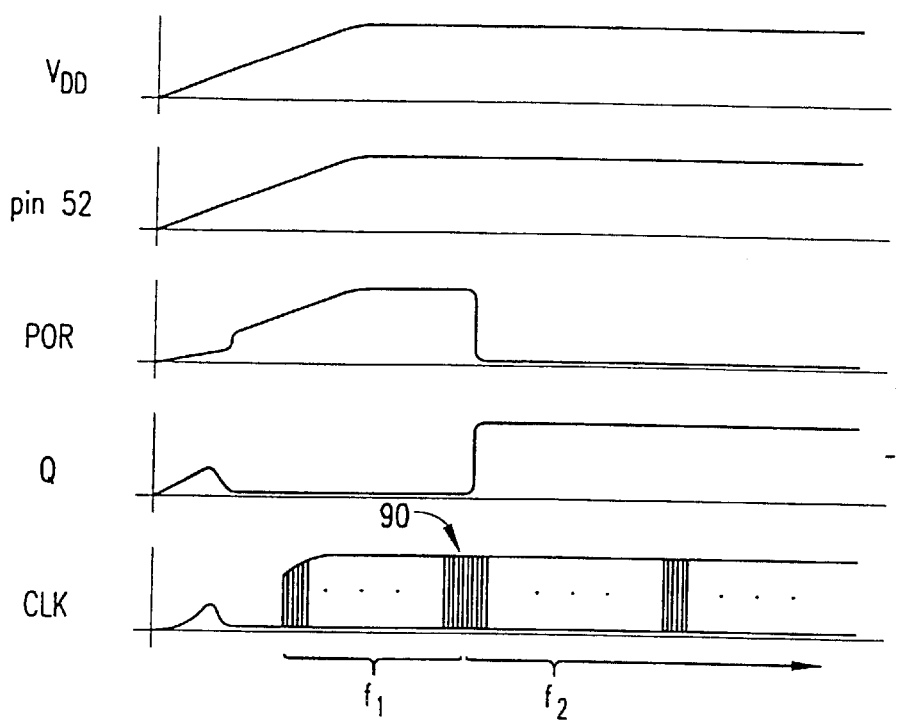
FIGS. 3A and 3B are waveform diagrams illustrating operation of the circuit of FIG. 1.
Figure 3B:
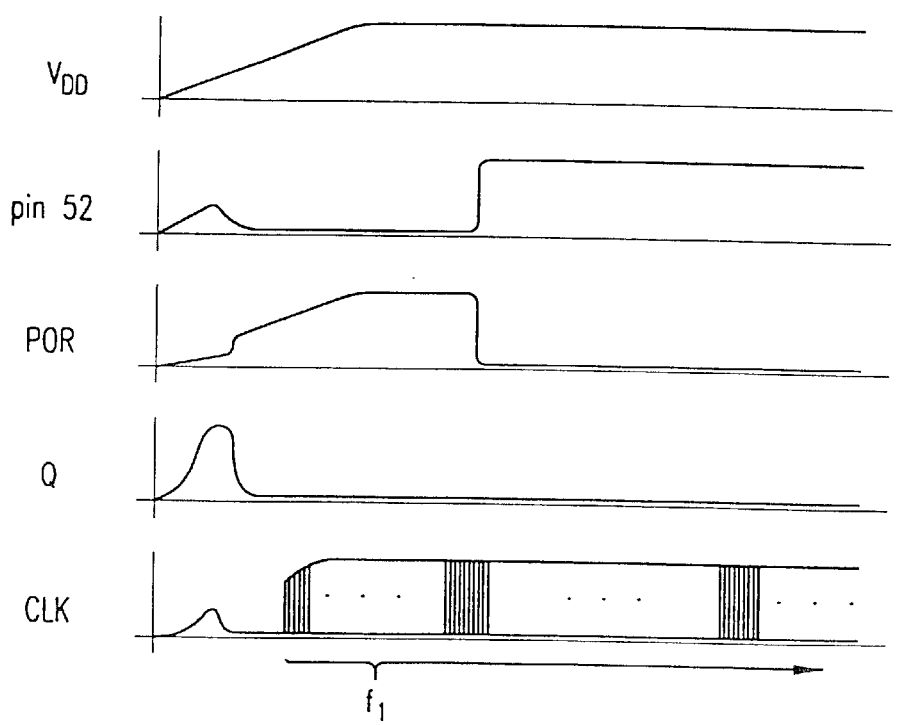

Reference is now additionally made to FIGS. 3A and 3B. Operation of the circuit 50 to perform the first and second functions is as follows: when Vdd ramps up from 0 volts to 3 volts, the power-on-reset signal follows until the point where Vdd is higher than 1.6 volts. At that point, power-on-reset goes low. In the meantime, when POR (through Vdd) exceeds the threshold voltage of the FET 56 (but is still lower than 1.6 volts), FET 56 turns on and behaves like a large resistor (for example, much larger than Rext). At this point, FET 54 is turned off, and the frequency $f_1$ of the output clock is determined solely as a function of the internal resistor Rin (i.e., $f_1=f(Rin)$).

Turning now specifically to FIG. 3A, assume that the external resistor Rext has been connected between Vdd and pin 52. In this state, the voltage at pin 52 is regarded as high. This high status of pin 52 is latched in the D-type flip-flop 58 on the negative edge of the clock input (C) which occurs when power-on-reset goes low as discussed above. This effectuates the first function of the circuit 50 to detect the connection of the external resistor Rext to the pin 52. With POR now low, FET 54 turns on and connects the external resistor Rext to node 36 (driving pin 52 high). The output (Q) of the flip-flop 58 is now high which turns off FET 38 in the current source 16 and thus disconnects the internal resistor Rin from node 36 which is replaced in the current source circuit by the external resistor Rext. This effectuates the second function of the circuit 50 where the frequency $f_2$ of the output clock is determined as a function of the external resistor Rext (i.e., $f_2=f(Rext)$). As illustrated generally at reference 90, it will be noted that a frequency change in the output clock CLK, from $f_1$ to $f_2$, occurs concurrent with POR going low and Q going high.

Reference is now made to FIG. 3B. Assuming that no external resistor Rext is connected between Vdd and pin 52, the voltage at pin 52 is regarded as low. This low status of pin 52 is latched in the D-type flip-flop 58 on the negative edge of the clock input (C) which occurs when power-on-reset goes low as discussed above. With POR now low, FET 54 turns off and disconnects pin 52 from node 36. The output (Q) of the flip-flop 58 is now low which turns on FET 38 in the current source 16 and thus connects the internal resistor Rin to node 38 in the current source circuit. In this configuration, the frequency $f_1$ of the output clock is solely a function of the internal resistor Rin (i.e., $f_1=f(Rin)$)

Figure 2:
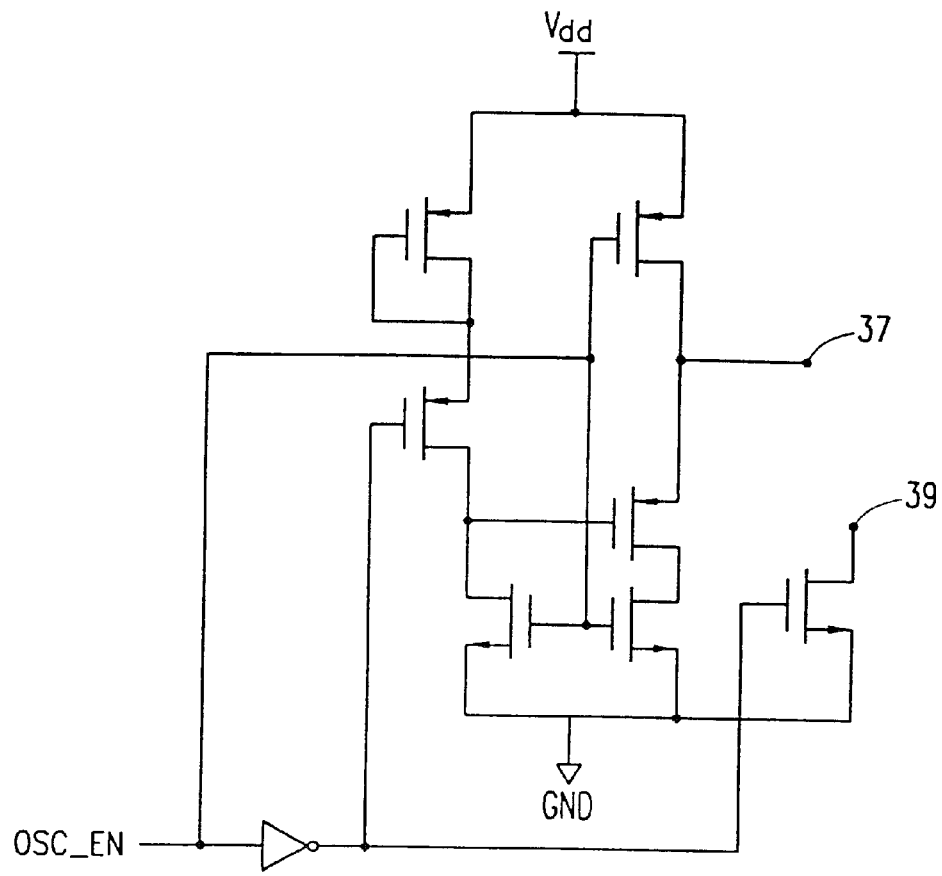
FIG. 2 is a schematic diagram of a startup circuit for use in conjunction with the circuit of FIG. 1.

Reference is now made to FIG. 2 wherein there is shown a schematic diagram of a startup circuit for use in conjunction with the circuit of FIG. 1. The current source 16 (see, FIG. 1) may require a startup circuit 70 to ensure proper operation. The startup circuit 70 has a conventional configuration as illustrated in FIG. 2 and is connected to the current source 16 at nodes 37 and 39. The signal OSC EN is a oscillator control signal that when logic high activates the startup circuit and places the oscillator in active mode, and conversely shuts down the oscillator when set at logic low. This circuit is preferably also integrated onto the chip 10 along with the oscillator 14 and circuit 50.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An integrated circuit chip, comprising:
    an RC oscillator circuit including an internal resistor and operating to generate an oscillator output signal having a frequency set as a function of a value of that internal resistor;
    a node on the chip to which an external resistor may be electrically connected;
    a first circuit connected to the node and operating to detect the presence of the external resistor having been electrically connected to the node; and
    a second circuit operating responsive to first circuit detection to connect the external resistor to the RC oscillator circuit and thus change the frequency of the oscillator output signal to be set as a function of at least a value of that external resistor.

2. The integrated circuit chip as in claim 1 wherein the node is electrically connected to an external pin of the chip to which the external resistor is connected.

3. The integrated circuit chip as in claim 1 where in the RC oscillator comprises:
    a current source circuit including the internal resistor that generates a stable current whose value is dependent on the value of the internal resistor; and
    an oscillator circuit including at least one capacitor and connected to receive the stable current generated by the current source circuit.

4. The integrated circuit chip as in claim 3 wherein the second circuit comprises a first switch operating to control connection of the internal resistor within the current source circuit.

5. The integrated circuit chip as in claim 4 wherein the second circuit comprises a second switch operating to control connection of the external resistor to the current source circuit in substitution for the internal resistor.

6. The integrated circuit chip as in claim 5 wherein the first circuit controls the first switch to disconnect the internal resistor out from the current source circuit with the second switch connecting the external resistor to the current source circuit in substitution for the disconnected internal resistor and the current source circuit generating the stable current whose value is instead dependent on the value of the external resistor.

7. The integrated circuit chip as in claim 3 wherein the oscillator circuit comprises:
   a first CMOS inverter having an input and an output;
   a first capacitor connected between the first CMOS inverter output and ground;
   a second CMOS inverter having an input and an output;
   a second capacitor connected between the second CMOS inverter output and ground;
   a pair of inverters series connected between the first CMOS inverter output and the second CMOS inverter input; and
   an inverter connected between the second CMOS inverter output and the first CMOS inverter input.

8. The integrated circuit chip as in claim 7 wherein the oscillator circuit further comprises:
   a first capacitor charging current source connected to the first CMOS inverter and controlled by the stable current output from the current source circuit; and
   a second capacitor charging current source connected to the second CMOS inverter and controlled by the stable current output from the current source circuit.

9. The integrated circuit chip as in claim 3 wherein the current source circuit comprises:
   a current mirror having a pair of legs; and
   a pair of transistors drain connected to the pair of legs of the current mirror and inter-connected with each other with one of the transistors being source connected to a voltage supply and the other of the transistors being source connected at a resistor substitution node to the voltage supply through the internal resistor.

10. The integrated circuit chip as in claim 9 wherein the pair of interconnected transistors are configured such that a gate of a first one of the transistors is connected to the source of a second one of the transistors and one terminal of the internal resistor at the resistor substitution node, while a gate of the second one of the transistors is connected to a drain of the first one of the transistors at one leg of the current mirror.

11. The integrated circuit chip as in claim 10 wherein the second circuit disconnects/connects the internal resistor from/to the current source circuit at the resistor substitution node and connects/disconnects the external resistor to/from the current source at the resistor substitution node in response to second circuit detection of the external resistor.

12. An integrated circuit chip, comprising:
   an on-chip oscillator including an on-chip resistor and capacitor and operating to generate an oscillator output signal having a frequency set as a function of a value of that internal resistor;
   first on-chip means for detecting connection to the chip of an off-chip frequency manipulation resistor; and
   second on-chip means responsive to a first means detection for connecting the off-chip frequency manipulation resistor to the oscillator in order to change the frequency of the oscillator output signal to be set as a function of at least a value of that off-chip frequency manipulation resistor.

13. The integrated circuit chip as in claim 12 where in the oscillator comprises:
   means for generating a stable current whose value is dependent on the value of the internal resistor; and
   oscillation means connected to receive the stable current and output a clock output signal.

14. The integrated circuit chip as in claim 13 wherein means for generating comprises a current mirror circuit operating to mirror a certain current whose value is set dependent on either the on-chip resistor or the off-chip frequency manipulation resistor, and wherein the second on-chip means selectively switches the on-chip resistor out of, and the off-chip resistor in to, the means for generating based on the detection performed by the first on-chip means to alter the frequency of the oscillator output signal.

15. The integrated circuit chip as in claim 13 wherein the oscillation means comprises:
   a first CMOS inverter having an input and an output;
   a first capacitor connected between the first CMOS inverter output and ground;
   a second CMOS inverter having an input and an output;
   a second capacitor connected between the second CMOS inverter output and ground;
   a pair of inverters series connected between the first CMOS inverter output and the second CMOS inverter input;
   an inverter connected between the second CMOS inverter output and the first CMOS inverter input;
   a first capacitor charging current source connected to the first CMOS inverter and controlled by the stable current; and
   a second capacitor charging current source connected to the second CMOS inverter and controlled by the stable current.

16. A method for integrated circuit chip operation of an on-chip RC oscillator circuit to allow for off-chip manipulation of the oscillator output signal frequency, comprising the steps of:
   detecting connection of an off-chip resistor to the integrated circuit chip;
   connecting off-chip resistor to the RC oscillator circuit in order to alter the oscillator output signal frequency from being set solely as a function of a value of the on-chip resistor to being set as a function of at least a value of the detected and connected off-chip resistor.

17. The method as in claim 16 wherein the step of detecting is performed in conjunction with a power-on-reset of the integrated circuit chip.

18. The method as in claim 16 wherein the step of connecting comprises the steps of:
   switching the on-chip resistor out of the RC oscillator circuit; and
   connecting the off-chip resistor to the RC oscillator circuit.

19. The method as in claim 16 further including the steps of:
   generating the oscillator output signal in response to a stable, but changeable, current;
   generating that stable, but changeable, current using a resistor; and
   selecting for that resistor one of either the on-chip or off-chip resistor based on the step of detecting.

* * * * *